United States Patent
Erving

(10) Patent No.: US 8,941,067 B2
(45) Date of Patent: Jan. 27, 2015

(54) LEADLESS CHIP CARRIER THERMAL ADAPTER FOR DEWAR PACKAGING

(71) Applicant: Raytheon Company, Waltham, MA (US)

(72) Inventor: Shawn Erving, Santa Barbara, CA (US)

(73) Assignee: Raytheon Company, Waltham, MA (US)

( * ) Notice: Subject to any disclaimer, the term of this patent is extended or adjusted under 35 U.S.C. 154(b) by 62 days.

(21) Appl. No.: 13/758,715

(22) Filed: Feb. 4, 2013

(65) Prior Publication Data

US 2014/0218866 A1 Aug. 7, 2014

(51) Int. Cl.
| | |
|---|---|
| *G01J 5/02* | (2006.01) |
| *F28F 9/007* | (2006.01) |
| *H05K 7/20* | (2006.01) |
| *G01J 5/04* | (2006.01) |
| *G01J 5/06* | (2006.01) |
| *H01L 31/024* | (2014.01) |

(52) U.S. Cl.
CPC ............ *F28F 9/007* (2013.01); *H05K 7/20509* (2013.01); *G01J 5/046* (2013.01); *G01J 5/041* (2013.01); *G01J 5/061* (2013.01); *H01L 31/024* (2013.01)
USPC ....................................................... 250/352

(58) Field of Classification Search
USPC ....................................................... 250/352
See application file for complete search history.

(56) References Cited

U.S. PATENT DOCUMENTS

| | | | |
|---|---|---|---|
| 4,918,312 A | 4/1990 | Wellman et al. | |
| 5,179,283 A | 1/1993 | Cockrum et al. | |
| 5,260,575 A | 11/1993 | Iwasaki et al. | |
| 5,834,778 A | 11/1998 | Veyrier et al. | |
| 6,587,001 B1 * | 7/2003 | Wyles et al. | 330/296 |
| 6,675,600 B1 | 1/2004 | Robillard et al. | |
| 2007/0001995 A1 * | 1/2007 | Lee | 345/102 |
| 2008/0113495 A1 | 5/2008 | Ginn et al. | |
| 2012/0187297 A1 | 7/2012 | Mullins et al. | |

FOREIGN PATENT DOCUMENTS

| | | |
|---|---|---|
| EP | 0 490 166 A1 | 6/1992 |
| WO | WO 2007/003729 A1 | 1/2007 |

OTHER PUBLICATIONS

International Search Report dated Dec. 13, 2013 in connection with International Patent Application No. PCT/US2013/063620, 5 pages.
Written Opinion of International Searching Authority dated Dec. 13, 2013 in connection with International Patent Application No. PCT/US2013/063620, 6 pages.

* cited by examiner

*Primary Examiner* — David Porta
*Assistant Examiner* — Abra Fein

(57) ABSTRACT

A method for cooling an imaging device includes providing, by a cold finger, a cold sink to the imaging device and conducting heat from a cold shield, a sensor chip assembly and a leadless chip carrier towards the cold finger through a plurality of parallel paths. The imaging device includes a dewar assembly having a cold shield, a sensor chip assembly disposed on a leadless chip carrier (LCC) and configured to capture an infrared image, a cold finger configured to cool the dewar assembly; and a thermal adapter. The thermal adapter is configured to draw heat from the cold shield and sensor chip assembly through a plurality of parallel paths towards the cold finger.

20 Claims, 4 Drawing Sheets

LEADLESS CHIP CARRIER THERMAL ADAPTER FOR DEWAR PACKAGING

TECHNICAL FIELD

This disclosure is generally directed to dewar packaging and, more particularly, to a system and method for a leadless chip carrier thermal adapter for dewar packaging.

BACKGROUND

A thermo-graphic camera, or infrared camera, forms an image using infrared radiation. Infrared cameras operate in wavelengths as long as 14,000 nm (14 μm). Many infrared cameras incorporate a cooled detector to capture the infrared image. Cooled detectors are typically contained in a dewar, or vacuum-sealed case, and are cryogenically cooled. Cooling is necessary for the operation of the semiconductor materials used. Cooled detectors typically operate in a range from 60 Kelvins (K) to 100K, with some operating in a range from 4K to room temperature. Cooling is power-hungry and time-consuming. The camera may need several minutes to cool down before it can begin working.

SUMMARY

This disclosure provides an apparatus for a thermal adapter for dewar packaging.

In a first embodiment, a dewar assembly includes a cold shield; a sensor chip assembly configured to capture an infrared image, the sensor chip assembly disposed on a leadless chip carrier (LCC) or a ceramic motherboard; a cold finger configured to cool the dewar assembly; and a thermal adapter. The thermal adapter is an interface to draw heat from the cold shield and sensor chip assembly through a plurality of parallel paths towards the cold finger.

In a second embodiment, a thermal adapter includes a thermal base, the thermal base comprising a multiple interfaces coupled to a cold finger; a center pedestal configured to bond to a leadless chip carrier (LCC) or a ceramic motherboard; and plurality of contact points configured to bond to respective corners of the LCC and a cold shield. The thermal adapter is configured to conduct heat from the LCC and the cold shield towards the cold finger via a plurality of parallel paths.

In a third embodiment, a method for cooling an imaging device includes providing, by a cold finger, a cold sink to the imaging device. The method also includes conducting, by a thermal adapter, heat from a cold shield, an optics assembly heat and a readout integrated circuit (ROIC) heatload towards the cold finger through a plurality of parallel paths.

Although specific advantages have been enumerated above, various embodiments may include some, none, or all of the enumerated advantages. Additionally, other technical advantages may become readily apparent to one of ordinary skill in the art after review of the following figures and description.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 7 described below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

In image capturing devices, infrared detectors use cooled detectors, which deliver very high infrared imaging performance. Cryogenic cooling is utilized to minimize the electrical noise due to the detector dark current. However, the cooling includes certain disadvantages, such as increased cost, size, power dissipation, cool-down time along with increased stressing of the focal plane (cooled detector) and decreased reliability.

Given such concerns, certain embodiments of the present disclosure teach a system and method to provide a leadless chip carrier (LCC) with a modified thermal adapter for dewar packaging capable of an accelerated cooling time of the focal plane. Additionally, in particular embodiments, the LCC with the modified thermal adapter for dewar packaging includes a number of resistance plates configured to inhibit damage to a sensor chip assembly (SCA).

Figure 1:
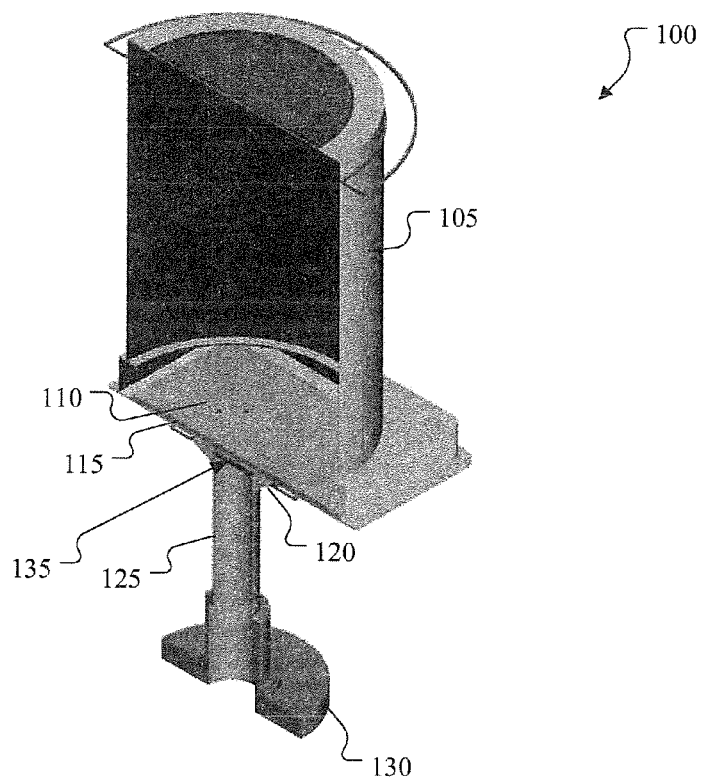
FIG. 1 illustrates a cross-sectional view of a dewar, vacuum sealed package, according to the present disclosure.

FIG. 1 illustrates a cross-sectional view of a dewar, vacuum sealed package, according to the present disclosure. The dewar 100 of FIG. 1 is configured to capture infrared images, such images emitting or reflecting light in a wavelength range of 750 nanometers (nm) to 1 millimeter (mm). Although certain details will be provided with reference to the components of the dewar 100 of FIG. 1, it should be understood that other embodiments may include more, less, or different components. The dewar 100 includes a cold shield 105, a focal plane 110 (e.g., camera), a motherboard 115, a thermal adapter 120 and a cold finger 125 (also referenced as "cold-finger").

Cooling the dewar 100 is accomplished by drawing heat from the top of the cold shield 105 and focal plane 110 into the cold finger 125 through a single path. The cold finger 125 is coupled to a mounting bracket 130, which is configured to mount the dewar 100 to a cooling system. The cold finger 125 can be any type of cold source such as a Stirling cryocooler or Pulse Tube cryocooler. As the cold finger 125 cools, the cold finger 125 draws heat away from the thermal adapter 120. The heat is drawn through the radial contact point between the cold finger 125 and the thermal adapter. As the thermal adapter 120 cools, the thermal adapter 120 draws heat from the motherboard 115. The heat is drawn from the motherboard 115 at or near where the cold finger 120 contacts the thermal adapter 120. That is, the heat transfer point occurs at or near a heat transfer point 135 around the circumference of the cold finger 125 where the thermal adapter 120 and cold finger 135 interface. As the motherboard 115 cools, heat is drawn from the focal plane 110 through a point at or near the heat transfer point 135. It will be understood that the heat transfer point 135 is illustrated for example purposes and is used to represent an area in which the heat transfer is the highest. As the motherboard 115 cools, heat is drawn from the cold shield 105. Therefore, in order to cool the cold shield 105, heat is drawn in series from the cold shield 105, through the focal plane 110, through the motherboard 115, through the thermal adapter 120 into the cold finger 125. That is, cooling is accomplished by cooling the thermal adapter 120, then cooling the motherboard 115, which cools the focal plane 110, which in turn cools the cold shield. The cooling of the dewar 100 can take several minutes. For example, the cool-down time for the dewar 100 approaches seventy-one (71) minutes to reach 130K.

As the capabilities at image capturing systems grow in regards to large format and high power Sensor Chip Assemblies (SCA), the need for packaging becomes more and more difficult. Two requirements of major concerns for packaging these new SCA's are: 1) handling the removal from Leadless Chip Carriers (LCC); and 2) Dewar cool-down requirements.

The removal from the test LCC requires either or, or a combination of: hash abrasive chemicals and thin razor wire type applications. Both of these techniques can damage these valuable SCAs. Certain embodiments provide an advantage such that removal of the SCA from the LCC is not required—that is, the LCC is integrated into the final packaging. Certain embodiments provide an LCC of the upmost quality level, which is somewhat customized, and not just commercial of the shelf (COTS).

Certain embodiments provide an advantage by removing a thermal impedance between the cold pump and the cold shield. By directly cooling the cold shield with the parallel thermal adapter, embodiments of the present disclosure short-circuit the cooling and, as such, cool the entire system at a much faster rate than previous designs. In certain embodiments, the cold shield is a cold shield a described in U.S. patent application Ser. No. 13/010,022; entitled "Cold Shield For A Cold Stage" filed on Jan. 20, 2011 and assigned to Ratheon Company (Waltham, Mass., US), the contents of which are incorporated by reference in their entirety.

Figure 2:
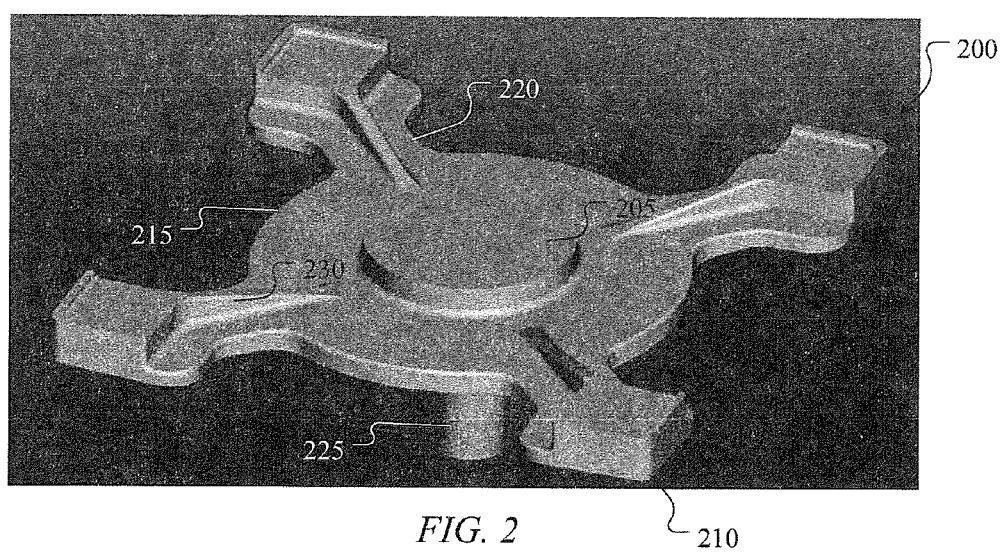
FIG. 2 illustrates a parallel thermal adapter according to embodiments of the present disclosure.

FIG. 2 illustrates a parallel thermal adapter according to embodiments of the present disclosure. The parallel thermal adapter 200 of FIG. 2 is configured to conduct a heat transfer through multiple paths. Although certain details will be provided with reference to the components of the parallel thermal adapter 200 of FIG. 2, it should be understood that other embodiments may include more, less, or different components. The parallel thermal adapter 200 can be constructed from any suitable material, such as a metal (e.g., aluminum) or a ceramic-based composite (e.g., alumina). The parallel thermal adapter 200 includes a center pedestal 205 and a plurality of contact points 210. The parallel thermal adapter 200 can be made of any suitable material capable of being cooled and capable of efficiently transferring heat. Each of the contact points 210 is configured to be bonded to both an LCC and a cold shield. The contact points include a first planar surface adapted to be bonded to the LCC. The contact points also include a second planar surface adapted to be bonded to the cold shield. In certain embodiments, one or more lateral edges of the contact points are adapted to bond to the cold shield. In addition, a top surface of the pedestal 205 includes a planar surface that is configured to be bonded to the LCC. The center pedestal 205 protrudes from a thermal base 215 providing a gap between the bonded LCC and the thermal base 215. Each of the contact points 210 is coupled to the thermal base 215 by an arm 220 of the thermal base 215. The arm is configured to conduct heat from each of the contact points 210 towards a cold finger 225. A mounting junction (not shown) is disposed on a back side of the thermal base, proximate to the center pedestal 205 and configured to couple the parallel thermal adapter 200 to the cold finger 225. The parallel thermal adapter 200 is configured to be cooled rapidly. The parallel thermal adapter 200 also is configured to efficiently conduct heat from a surface of each of the contact points 210 and the center pedestal 205 towards the cold finger 225. For example, each arm 220 can include a riser portion 230 that provides for a quicker and more efficient heat transfer from a surface of a respective contact point 210 and mechanical stiffness.

The parallel thermal adapter 200 is configured to conduct heat via each of the contact points 210. Accordingly, heat is conducted in parallel via a path through the center pedestal 205 through the thermal base 215 into the cold finger 225 and through multiple paths provided by the contact points 210 disposed at the end of each arm 220 through the respective riser 230 and arm 220 and thermal base 215 into the cold finger 225.

Figure 3:
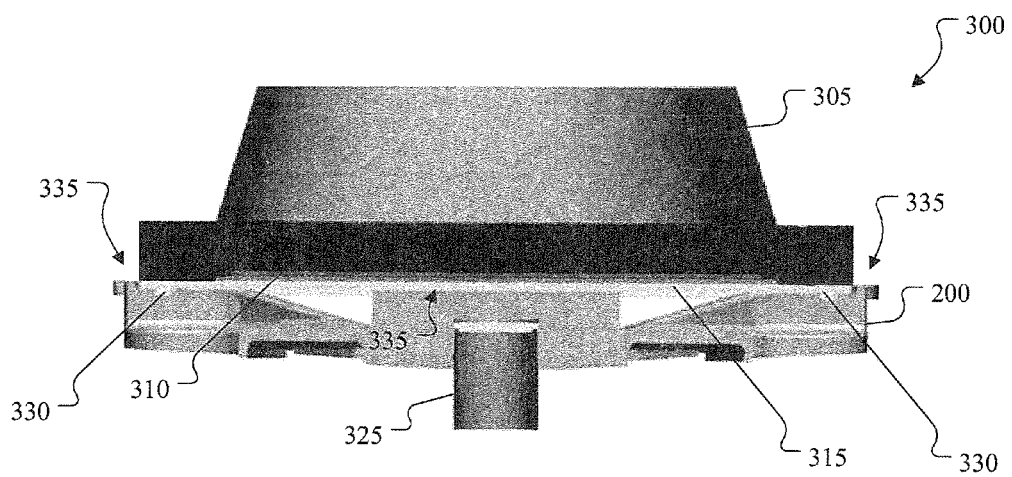
FIG. 3 illustrates a cross-sectional view of a dewar, vacuum sealed package with a parallel thermal adapter according to embodiments of the present disclosure.

FIG. 3 illustrates a cross-sectional view of a dewar, vacuum sealed package with a parallel thermal adapter according to embodiments of the present disclosure. The dewar 300 of FIG. 3 is configured to capture infrared images, such images emitting or reflecting light in a wavelength range of 750 nanometers (nm) to 1 millimeter (mm). Although certain details will be provided with reference to the components of the dewar 300 of FIG. 3, it should be understood that other embodiments may include more, less, or different components. The dewar 300 includes a cold shield 305, sensor chip assembly (SCA) 310 (e.g., a focal plane or camera), a leadless chip carrier (LCC) 315 (e.g., motherboard), a parallel thermal adapter 200, a cold finger 325 and capacitors 330. The cold finger 325 is coupled to the parallel thermal adapter at a mounting point. The SCA 330 is bonded to the LCC 315. The LCC 315 is coupled to the parallel thermal adapter 200 at multiple points. The cold shield 305 is coupled to the parallel thermal adapter 200 at multiple points.

The SCA 310 is an optics assembly configured to capture images, such as infrared images and includes readout integrated circuitry (ROIC). The ROIC converts information received from the SCA into a format for generating the image on a display medium. The SCA utilizes energy to capture the image and generates considerable heat in the process. In addition, the ROIC also generates heat while processing the information from the SCA. However, in order for the SCA to properly capture infrared images, the optics assembly should be cold, e.g., between 60-100K.

Cooling the dewar 300 is accomplished by drawing heat from the top of the cold shield 305 into the cold finger 325 through multiple paths. The cold finger 325 is coupled on a first end to a junction of the parallel thermal adapter 200 and on a second end to a mounting bracket (not shown), which is configured to mount the dewar 300 to another apparatus. The cold finger 325 can be any type of cold source such as a Stirling cryocooler or a Pulse Tube cryocooler. As the cold finger 325 cools, the cold finger 325 draws heat away from the parallel thermal adapter 200. The heat is drawn through the contact points between the cold finger 325 and the parallel thermal adapter 200. Heat is drawn in through the through the sides of the cold finger 325 that are in contact the parallel thermal adapter 200. As the parallel thermal adapter 200 cools, the parallel thermal adapter 200 draws heat from the LCC 315 through multiple contact points 335. In addition, since the cold shield also is coupled to the parallel thermal adapter 200, heat is drawn from the cold shield 305 into the parallel thermal adapter 200. Therefore, as the parallel thermal adapter 200 cools, the heat is drawn from the LCC 315 and the cold shield 305 in parallel. As the LCC 315 cools, heat is drawn from the SCA 310 through a point at or near the heat transfer points, i.e., multiple contact points 335. As the SCA 310 cools, heat also is drawn from the cold shield 305 into the SCA 310. Therefore, the cold shield 305 is cooled along multiple parallel paths. That is, heat is drawn in parallel from the cold shield 305 into the parallel thermal adapter 200 into the cold finger 325, as well as through the SCA 110-LCC 315—and parallel thermal adapter 200 into the cold finger 325. The cooling of the dewar 300 can take substantially less time than conventional systems. For example, the cool-down time for the dewar 300 approaches nineteen (19) minutes to reach 130K.

Figure 4:
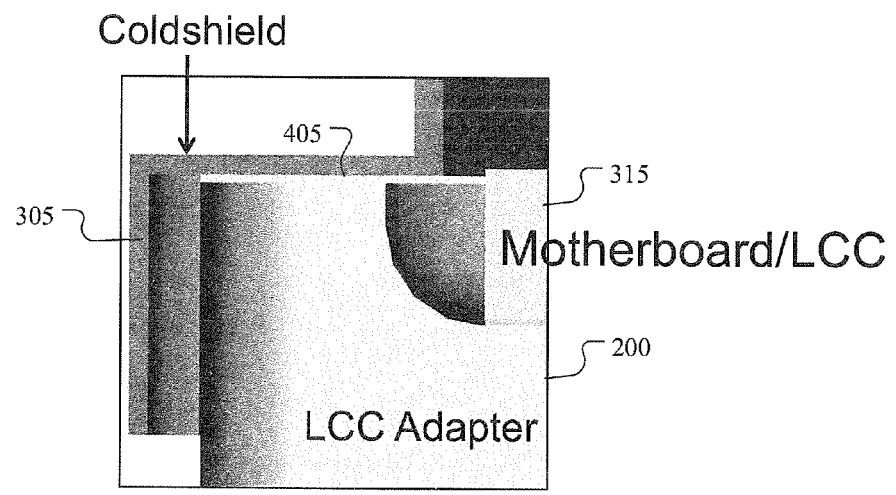
FIG. 4 illustrates a detailed view of a portion of the dewar, vacuum sealed package with modified thermal adapter of FIG. 3.

FIG. 4 illustrates a detailed view of a portion of the dewar, vacuum sealed package with modified thermal adapter of FIG. 3. As shown in FIG. 4, the cold shield 305 is bonded to the parallel thermal adapter 200. A bondline 405 is created between the cold shield 305 and the parallel thermal adapter 200. The LCC 315 also is bonded to the parallel thermal adapter 200 as well as the cold shield 305. Therefore, heat transfer occurs along multiple parallel paths between the cold shield 305 and the LCC 315, the cold shield and the parallel thermal adapter 200, and the LCC 315 and the parallel thermal adapter 200.

Figure 5:
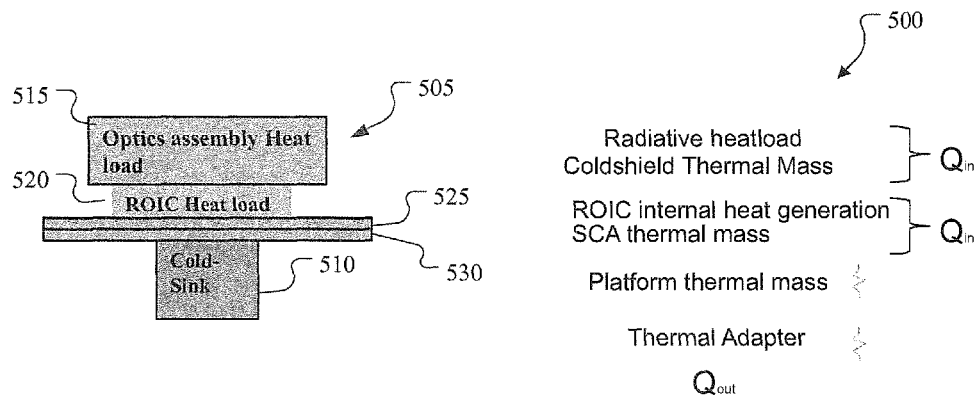
FIG. 5 illustrates a process for cooling an imager using series conduction.

As shown in FIGS. 3 and 4, embodiments of the present disclosure of thermal shorts allows for rapid cool-down capability. The dewar 300 is configured such that both the LCC 315 and cold shield 305 are bonded at the corners only, with vacant area (e.g., a gap) exposed below the LCC 315 in four different areas. This type of bonding, with vacant areas exposes provides for:
  1) placement of necessary capacitors 330;
  2) placement of electrical feedthru's necessary for operation and output of the SCA 310; and
  3) reduction of Joule mass FIG. 5 illustrates a process 500 for cooling an imager using series conduction. A cold sink 510 is applied to cool the imager assembly 505. Heat ($Q_{in}$) generated by an optics heat load 515 transfers via a series path from the radiative heat load (e.g., the optics assembly heat load 515) into a cold shield thermal mass. The ROIC 520 also is an internal heat generator and is added to the heat ($Q_{in}$) emitted from the optics heat load. The heat ($Q_{in}$) generated by the ROIC 520, and the heat ($Q_{in}$) from the optics heat assembly 515 and cold shield thermal mass, transfers from the ROIC heat load 520 to an SCA thermal mass. Heat ($Q_{out}$) then transfers from the SCA thermal mass to a platform thermal mass 525 into a thermal adaptor 530. As the thermal adaptor is cooled by the cold sink, heat ($Q_{out}$) transfers to the cold sink from the thermal adaptor. Therefore, heat transfers in a series path from the Optics heatload 515 into the ROIC heatload 520, which adds more heat, and into the SCA thermal mass and platform thermal mass 525 through the thermal adapter 530 into the cold sink 505.

Figure 6:
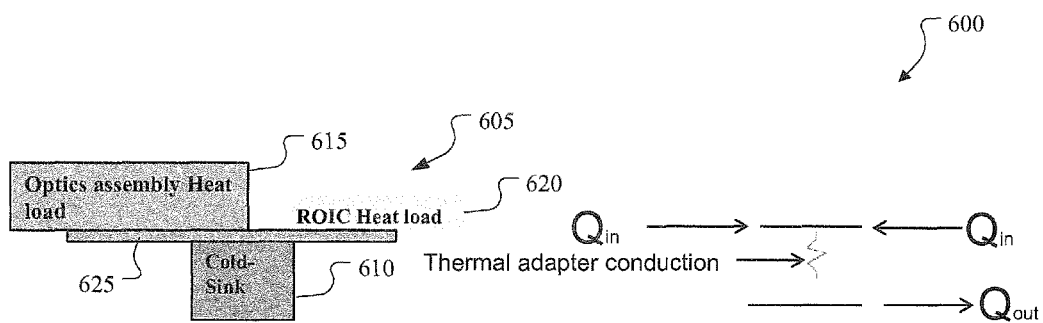
FIG. 6 illustrates a process for cooling an imager using parallel conduction according to embodiments of the present disclosure.

FIG. 6 illustrates a process for cooling an imager using parallel conduction according to embodiments of the present disclosure. Although this process will be described, other processes may be utilized, including those disclosed herein. The process 600 of FIG. 6 includes an accelerated cool-down in which heat is transferred through multiple parallel paths. A cold sink 610 is applied to cool the imager assembly 605. Heat transfers via multiple parallel paths from the radiative heat load (e.g., the optics assembly heat load 615) and ROIC heat load 620 into a parallel thermal adapter 625 and into the cold sink. That is, heat ($Q_{in}$) generated by the optics heat load transfers into the parallel thermal adapter. In addition, heat ($Q_{in}$) generated by the ROIC also transfers from the ROIC heat load to the parallel thermal adapter. As the parallel thermal adapter is cooled by the cold sink, heat ($Q_{out}$) transfers to the cold sink from the parallel thermal adapter. Therefore, heat transfers in multiple parallel paths from the Optics heatload and the ROIC heatload into the parallel thermal adapter, which transfers heat into the cold sink.

Certain embodiments provide a configuration to inhibit damage to the LCC and SCA. An SCA is very sensitive to bending, warping or other constriction expansion movement. Such movement can cause severe damage to the SCA. Depending upon the thermal characteristics of the parallel thermal adapter, large temperature swings, such as from room temperature to 130K, can cause the materials that constitute the parallel thermal adapter to move substantially. For example, when the parallel thermal adapter is constructed from aluminum, which as a high coefficient of thermal expansion, the parallel thermal adapter will contract substantially as it is cooled. The constriction of the parallel thermal adapter will cause a warping of the SCA, also known as causing the SCA to curve or "potato chip."

Figure 7:
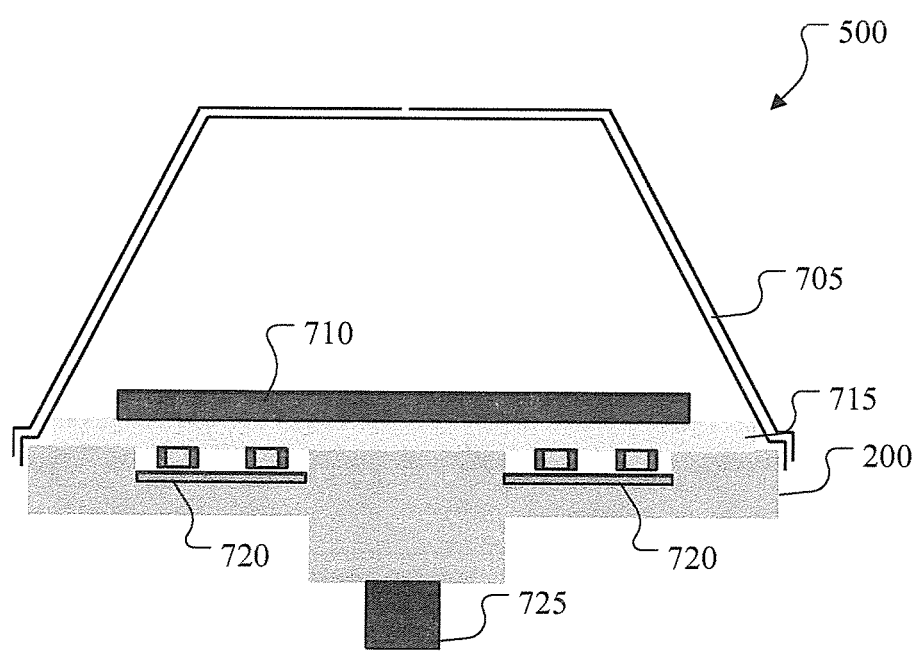
FIG. 7 illustrates a cross-sectional view of a dewar, vacuum sealed package with modified thermal adapter and a resistance plate according to embodiments of the present disclosure.

FIG. 7 illustrates a cross-sectional view of a dewar, vacuum sealed package with modified thermal adapter and a resistance plate according to embodiments of the present disclosure. The dewar 700 of FIG. 7 is configured to capture infrared images, such images emitting or reflecting light in a wavelength range of 750 nm to 1 mm. Although certain details will be provided with reference to the components of the dewar 700 of FIG. 7, it should be understood that other embodiments may include more, less, or different components. The dewar 700 can be like the dewar 300 of FIG. 3. Accordingly, the dewar 700 includes a cold shield 705, SCA 710 (e.g., a focal plane or camera), an LCC 715 (e.g., motherboard), a parallel thermal adapter 200, a cold finger 725, capacitors 730 and one or more resistance plates 720. The cold finger 725 is coupled to the parallel thermal adapter at a mounting point. The SCA 710 is bonded to the LCC 715. The LCC 715 is coupled to the parallel thermal adapter 200 at multiple points. The cold shield 705 is coupled to the parallel thermal adapter 200 at multiple points.

The resistance plates 720 can be constructed from an INVAR plate for example. INVAR, also known as FeNi36 or 64FeNi, is a nickel iron alloy notable for its uniquely low coefficient of thermal expansion (CTE or $\alpha$). As such, INVAR is a material that is more resistant to contraction when cooled. Accordingly, as the parallel thermal adapter 200 constricts, the resistance plates 720 maintain a size and shape necessary to prevents contraction or shrinking along a surface of the SCA. Therefore, the resistance plates 720 are configured to inhibit a warping, contraction, constriction, or cracking of the LCC and SCA.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A dewar assembly comprising:
    a cold shield;
    a sensor chip assembly configured to capture an infrared image, the sensor chip assembly disposed on a leadless chip carrier (LCC);
    a cold finger configured to cool the dewar assembly; and
    a thermal adapter configured to draw heat from the cold shield and sensor chip assembly through a plurality of parallel paths towards the cold finger.

2. The dewar assembly of claim 1, wherein the thermal adapter includes a plurality of contact points, and wherein respective ones of the plurality of contact points are bonded to respective points of the cold shield and the LCC.

3. The dewar assembly of claim 1, further comprising a center pedestal contact disposed central to a plurality of contact points and proximate the cold finger and bonded to the LCC and configured to conduct heat toward the cold finger,
    wherein the plurality of contact points comprise at least one contact point disposed on an end of an arm configured to conduct heat from the at least one contact point towards the cold finger, and wherein the LCC is bonded at respective corners to respective ones of the plurality of contact points.

4. The dewar assembly of claim 1, further comprising at least one resistive plate configured to inhibit damage to the sensor chip assembly resulting from a cooling of the dewar assembly.

5. The dewar assembly of claim 4, wherein the at least one resistive plate is disposed between the thermal adapter and the LCC.

6. The dewar assembly of claim 4, wherein the at least one resistive plate comprises a nickel iron alloy material having a low coefficient of thermal expansion.

7. The dewar assembly of claim 1, wherein the thermal adapter comprises a metal or a ceramic based composite.

8. A thermal adapter comprising:
    a thermal base, the thermal base comprising a junction configured to couple to a cold finger;
    a center pedestal configured to bond to a leadless chip carrier (LCC), the center pedestal disposed on an opposite side of the thermal base from the junction; and
    a plurality of contact points configured to bond to respective corners of the LCC and a cold shield, wherein the thermal adapter is configured to conduct heat from the LCC and the cold shield towards the cold finger via a plurality of parallel paths.

9. The thermal adapter of claim 8, wherein the center pedestal comprises a raised portion of the thermal base and having a planar surface configured to bond to the LCC.

10. The thermal adapter of claim 9, wherein each of the plurality of contact points is coupled to the thermal base via an arm, each arm configured to conduct heat towards the cold finger from a respective one of the plurality of contact points, and wherein each of the plurality of contact points comprise a first planar surface portion configured to bond to a respective corner of the LCC and a second planar surface portion configured to bond to the cold shield, the first planar surface configured to align with the planar surface of the center pedestal.

11. The thermal adapter of claim 10, wherein the planar surface of the center pedestal and the first planar surface of each of the plurality of contact points are configured to form a gap between the LCC and the thermal base.

12. The thermal adapter of claim 11, wherein each arm comprises a riser portion configured to conduct from at least one of the first planar surface and second planar surface of a respective one of the plurality of contact points.

13. The thermal adapter of claim 8, further comprising at least one resistive plate configured to inhibit damage to a sensor chip assembly resulting from a cooling of the dewar assembly, the LCC comprising the sensor chip assembly.

14. The thermal adapter of claim 13, wherein the at least one resistive plate comprises a nickel iron alloy material having a low coefficient of thermal expansion.

15. A method for cooling an imaging device, the method comprising:
    providing, by a cold finger, a cold sink to the imaging device; and
    conducting, by a thermal adapter, heat from a cold shield, an optics assembly heat load and a readout integrated circuit (ROIC) heat load towards the cold finger through a plurality of parallel paths.

16. The method of claim 15, wherein the thermal adapter includes a plurality of contact points, and wherein conducting comprises bonding respective ones of the plurality of contact points to respective points of the cold shield, the optics assembly heat load, and the ROIC heat load.

17. The method of claim 16, wherein the at least one resistive plate comprises a nickel iron alloy material having a low coefficient of thermal expansion.

18. The method of claim 15, further comprising inhibiting, by at least one resistive plate, damage to at least one of the optics assembly heat load and the ROIC heat load resulting from a cooling of the optics assembly heat load.

19. The method of claim 18, wherein the at least one resistive plate is disposed between the thermal adapter and at least one of the optics assembly heat load and the ROIC heat load.

20. The method of claim 15, wherein the thermal adapter comprises aluminum or an alumina.

* * * * *